United States Patent [19]

Lace

[11] 4,168,516

[45] Sep. 18, 1979

[54] PRECISION SPEED SWITCH CONTROL

[75] Inventor: Melvin A. Lace, Prospect Heights, Ill.

[73] Assignee: Synchro-Start Products, Inc., Skokie, Ill.

[21] Appl. No.: 839,193

[22] Filed: Oct. 4, 1977

Related U.S. Application Data

[63] Continuation-in-part of Ser. No. 745,453, Nov. 26, 1976, abandoned, and Ser. No. 732,332, Oct. 15, 1976, Pat. No. 4,086,647.

[51] Int. Cl.² ............................................... H02P 3/00
[52] U.S. Cl. ....................................... 361/241; 361/51
[58] Field of Search ................. 361/241, 239, 256, 51, 361/236; 318/463, 464, 327, 328, 330; 324/161, 163, 166, 167, 173, 174; 123/102

[56] References Cited

U.S. PATENT DOCUMENTS

| 3,207,950 | 9/1965 | Smith | 361/239 X |
| 3,440,433 | 4/1969 | Coman | 361/241 X |
| 3,805,161 | 4/1974 | Bayha et al. | 361/239 X |
| 3,845,375 | 10/1974 | Stiebel | 361/51 X |

Primary Examiner—Patrick R. Salce
Attorney, Agent, or Firm—Kinzer, Plyer, Dorn & McEachran

[57] ABSTRACT

A speed switch control comprising a subfractional permanent magnet AC generator generating an AC signal varying in amplitude with saft speed variations; the AC signal is rectified and compared with a regulated DC reference to generate first and second threshold signals indicative of shaft speeds over and under a critical value. A switch actuator circuit develops "on" and "off" switch actuator signals, from the threshold signals to actuate a two-terminal solid state switch between on and off conditions; the "off" signal is continuous but the "on" signal is a high-duty-cycle semi-continuous signal including brief recurring "off" intervals. A power storage/supply circuit, connected in parallel with the switch terminals, which recharges during switch "off" intervals, affords the power supply for the threshold and switch actuator circuits.

8 Claims, 5 Drawing Figures

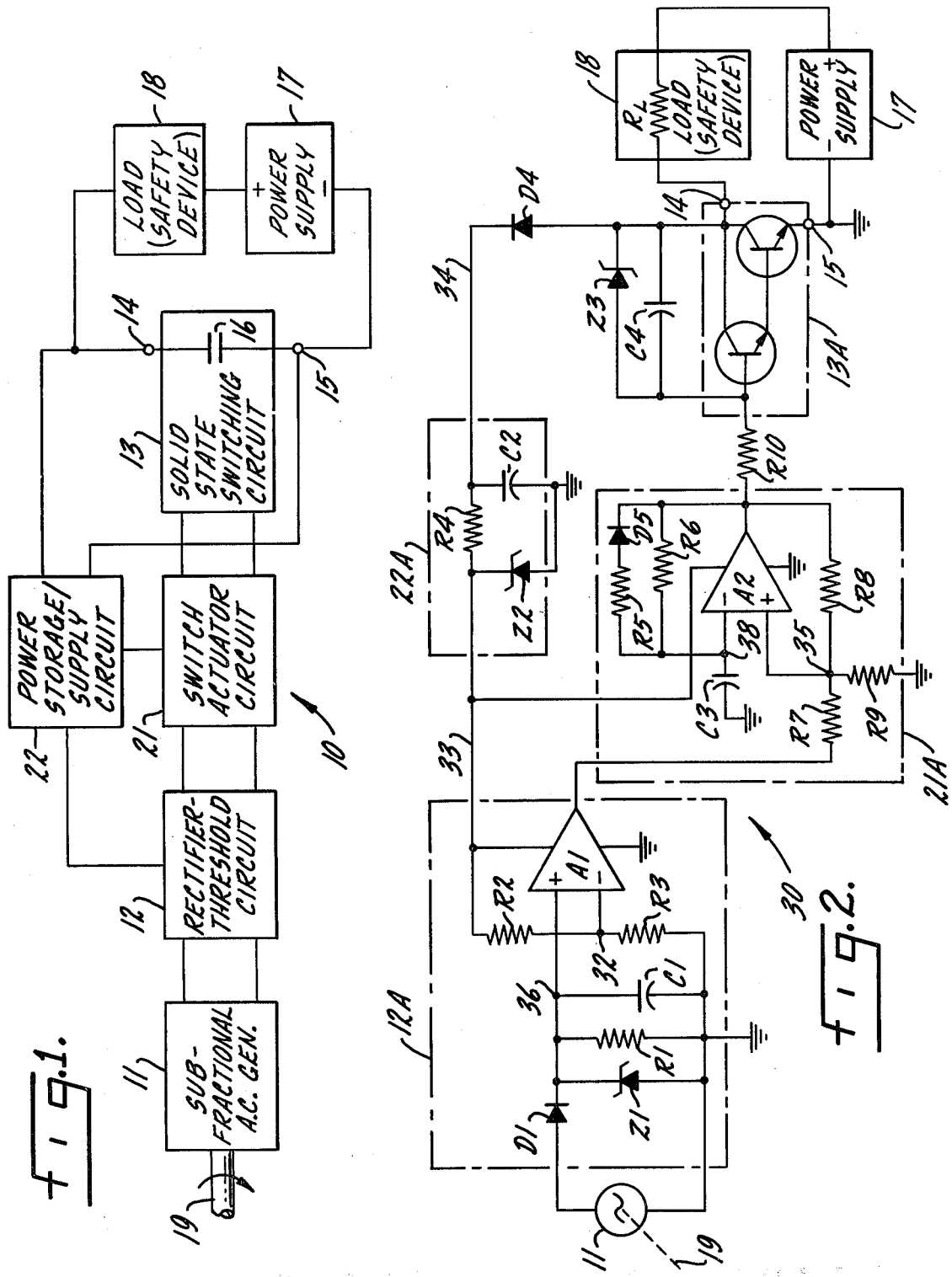

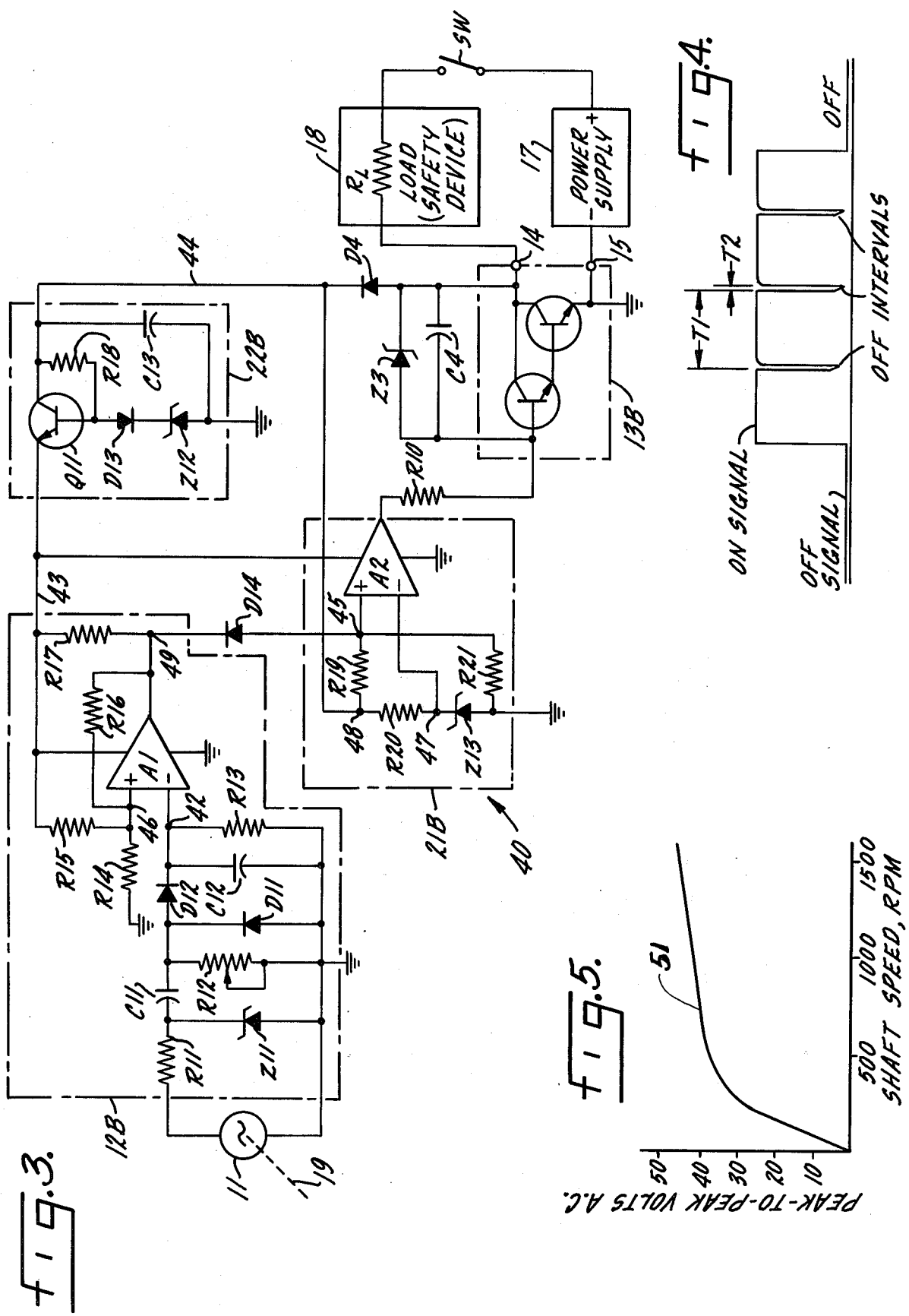

PRECISION SPEED SWITCH CONTROL

CROSS REFERENCE TO RELATED APPLICATIONS

The present application is an improvement upon and constitutes a continuation-in-part of the co-pending applications of Melvin A. Lace, Ser. No. 745,453 filed Nov. 26, 1976, (now abandoned) and Ser. No. 732,332 filed Oct. 15, 1976, now U.S. Pat. No. 4,086,647 issued Apr. 25, 1976. A preferred AC generator input device for the present invention is disclosed in the co-pending application of Melvin A. Lace Ser. No. 729,272 filed Oct. 4, 1976, now U.S. Pat. No. 4,074,157 issued Feb. 14, 1978.

BACKGROUND OF THE INVENTION

There are numerous applications in which it is necessary or desirable to control some safety interlock or other device in accordance with the speed of a rotating shaft. Vehicular applications are common; for example, a control to latch or close the doors of a passenger vehicle whenever the vehicle is moving above a predetermined threshold speed, or an electrically actuated interlock mechanism to preclude shifting the transmission into reverse whenever the vehicle is moving forward at even a limited threshold speed, or vice versa. Similar speed switch control needs, based upon the rotational speed of a shaft or like rotary member, are also commonly encountered in machine tools and other industrial equipment.

The requirements imposed upon speed switch controls, particularly those employed in vehicular applications, are frequently quite severe. Thus, the control may be subjected to high levels of vibration and to substantial shock forces. Electrical transients of substantial magnitude may be encountered. Because the control does not perform a primary operational function, it is frequently subject to severe cost limitations. In addition, it is highly desirable that the electrical connections to the control be as simple as possible, preferably constituting a simple two-terminal connection, to minimize cost and to facilitate replacement when necessary.

A variety of different speed switch controls have been devised for use in applications of this kind; many start with an input signal derived from a small AC generator driven by the shaft or like rotary member being monitored. The circuits of these devices have often been undesirably complex and costly, particularly when operation is based upon the frequency of the AC input signal, requiring a frequency/voltage conversion stage as a part of the control circuitry. These controls are difficult to construct in a form rugged enough for vehicular applications, in large part due to the circuit complexities introduced by frequency/voltage conversion. Moreover, many of these speed switch controls require three or more terminal connections. These problems are particularly acute in speed controls applied to vehicles.

Inexpensive precision two-terminal speed switch controls are described in the aforementioned co-pending United States applications of M.A. Lace, Ser. Nos. 732,332 (now U.S. Pat. No. 4,086,647) and 745,453 (now abandoned). But those controls are not satisfactory for critical speeds below ten revolutions per minute, where the output amplitude of the AC generator is quite small. This is particularly true in passenger vehicle safety control applications, where a shaft speed of two rpm or even less may constitute the critical speed.

Moreover, a number of other important operating characteristics have been difficult and sometimes impossible to realize with previously known speed switch controls. Thus, it is highly desirable to provide a single basic speed switch control circuit that can be readily converted from operation as a normally open switch to operation as a normally closed switch, and vice versa, to meet the varying requirements of different safety devices and other loads. It is equally desirable to have a single basic speed switch control circuit that is capable of operation over a broad range of critical rotational speeds, from nearly zero rpm to hundreds of revolutions per minute, to minimize custom design of circuits to fit individual applications. Another critical requirement, in many applications, is the limination of "hunting" when the rotational speed of the input shaft is subject to substantial variation over a brief period of time. In addition, a practical and effective precision speed switch control should require only a low power drain but should be capable of handling relatively high currents, so that it can be readily adapted to a variety of different specific applications.

SUMMARY OF THE INVENTION

It is a principal object of the present invention, therefore, to provide a new and improved solid state electronic speed switch control, utilizing an input signal from a subfractional permanent magnet AC generator driven by a rotating shaft or like rotating member, that effectively overcomes or minimizes the problems and difficulties of previously known controls as described above.

A particular object of the invention is to provide a new and improved speed switch control for a rotary shaft, employing simple solid state circuits that require only two terminals for both load and power supply connections, that affords precision operation over a broad speed range extending down to speeds as low as one or two rpm.

Another specific object of the invention is to provide a new and improved speed switch control that is readily convertible from operation as a normally open switch to operation as a normally closed switch, and vice versa, by a simple interchange of two circuit connections.

Another object of the invention is to provide a precision speed switch control, having a broad range of operating speeds, that can be readily adjusted for different dropout delays, the dropout delay constituting the time interval between deceleration of an input shaft below a critical speed and the actual reversion of the switch to an original operating condition.

Accordingly, the invention relates to a two-terminal precision speed switch control actuated by changes in the rotational speed of a shaft and adaptable to operation over a broad speed range down to less than tem rpm. The control comprises a sub-fractional AC generator, connectible to a rotary shaft, for generating an AC signal having an amplitude which varies with changes in shaft speed; a threshold circuit is connected to the generator and develops first and second threshold signals, one indicative of an AC signal input exceeding a given threshold amplitude corresponding to a critical shaft speed and the other indicative of an AC signal input below the threshold amplitude. A switch actuator circuit is coupled to the threshold circuit, for developing ON and OFF switch actuation signals corresponding to the first and second threshold signals, the OFF signal being a continuous DC signal of high duty cycle including brief recurring OFF intervals. A solid-state switching circuit, having two switch terminals connectible in series with an external power supply in an operating circuit for a controlled load, has its actuation input connected to the switch actuator circuit, actuatable to an "on" condition in which the impedance across the switch terminals is very low, in response to the ON switch actuation signal, and actuatable to an "off" condition in which the impedance across the switch terminals is very high, in response to the OFF switch actuation signal. A power storage/supply circuit, is connected in parallel with the switch terminals, affording a power supply for the threshold circuit and the switch actuator circuit, and including a storage device which is re-charged during intervals in which the switching circuit is in its "off" condition.

BRIEF DESCRIPTION OF THE DRAWINGS

FIG. 1 is a simplified block diagram illustrating some of the principles of the present invention;

FIG. 2 is a schematic circuit diagram for a speed switch control constructed in accordance with one embodiment of the present invention;

FIG. 3 is a schematic circuit diagram illustrating a speed switch control constructed in accordance with another embodiment of the invention;

FIG. 4 illustrates certain operating characteristics of the speed switch control circuits of FIGS. 2 and 3; and FIG. 5 illustrates the peak-to-peak output of an AC generator used as the input device for the speed switch controls of FIGS. 1–3.

DESCRIPTION OF THE PREFERRED EMBODIMENTS

FIG. 1 provides a block diagram of a precision speed switch control 10 which incorporates some of the principles of the present invention. Control 10 comprises a multi-pole sub-fractional permanent magnet AC generator 11 having an input shaft 19. In a given application, by way of example, shaft 19 may be driven from the speedometer cable, the drive shaft, or some operating element in the transmission of a vehicle. On the other hand, shaft 19 may also be driven from the operating shaft of a machine tool or other industrial machine that must be monitored for a safety function or other control purpose. The preferred construction for generator 11 is the sixty pole permanent magnet AC generator disclosed and claimed in the co-pending U.S. patent application of M.A. Lace, Ser. No. 729,272 filed Oct. 4, 1976, now U.S. Pat. No. 4,074,157.

The output of the AC generator 11 is electrically connected to a threshold circuit 12 that rectifies the AC input and that develops an output comprising two different threshold signals. A first threshold signal is generated by circuit 12 in response to an AC signal input below a given threshold amplitude corresponding to a critical speed for shaft 19. The second threshold signal output from circuit 12 indicates an AC signal input corresponding to a shaft speed exceeding the critical speed. The output from threshold circuit 12 is supplied to a switch actuator circuit 21.

Actuator circuit 21 develops OFF and ON switch actuation signals corresponding to the first and second threshold signals from circuit 12. These switch actuation signals are in turn applied to a solid state switching circuit 13. Circuit 13 has two switch terminals 14 and 15, shown as connected to a pair of normally open switch contacts 16. Contacts 16 are included in FIG. 1 merely for purposes of illustration; the solid state switch 13 actually does not include any mechanically actuatable contacts, but uses a solid state circuit to perform an equivalent switching function. In fact, a mechanical switch would not be usable for contact 16, due to inertia in operation, as will be apparent from the operational description set forth hereinafter.

Switch terminals 14 and 15 are electrically connected in series with an external power supply 17 and a load 18. In a vehicular application, power supply 17 may comprise the vehicle battery. In an industrial application, a power supply circuit energized from a local utility or other source may be employed. An internal power storage/supply circuit 22 is connected in parallel with the switch terminals 14 and 15 and affords a power supply for both the threshold circuit 12 and the switch actuator circuit 21.

Load 18 is most frequently an alarm, a safety interlock circuit, or some other safety device. For example, in a bus or other passenger vehicle, load 18 may comprise an electrically-actuated interlock to close or at least to prevent opening of a door whenever the vehicle is moving above some critical speed. In some instances, that critical speed may be represented by a very low speed for shaft 19, such as one or two rpm. In another vehicular application, load 18 may comprise an interlock to prevent shifting of the transmission of the vehicle into reverse gear when the vehicle is moving in a forward direction, or vice versa. Again, the critical speed for shaft 19 at which the safety device of load 18 must be operated may be quite low. Of course, load 18 may also comprise a simple visual or audible alarm in either industrial or vehicular applications.

In the operation of the speed switch control 10 of FIG. 1, generator 11 develops an initial AC signal having an amplitude generally representative of the rotational speed of its shaft 19. The relationship between the amplitude of the output signal from generator 11 and the speed of shaft 19 is seldom truly linear. More commonly, the peak-to-peak output voltage of generator 11 usually conforms to a characteristic similar to curve 51 in FIG. 5, with the voltage rising rapidly for low and moderate speeds and increasing much more gradually at higher speeds. However, over an initial speed range, in this instance from about zero to nearly 400 rpm, the speed-voltage curve 51 is a close approximation to a linear relationship, so that the output amplitude of the AC signal from generator 11 is essentially representative of the rotational speed of shaft 19.

The AC signal from generator 11 (FIG. 1) is rectified in threshold circuit 12 and is utilized in that circuit to develop first and second threshold signals, one indicative of shaft speeds exceeding a critical level and the other indicative of shaft speeds below that critical level. These two threshold signals are supplied to switch actuator circuit 21, which develops ON and OFF switch actuation signals corresponding to the first and second threshold signals, respectively. These ON and OFF output signals are illustrated in FIG. 4. As shown therein, the OFF signal is a continuous DC signal, whereas the ON signal is a semi-continuous DC signal of high duty cycle including a number of recurring OFF intervals. The ON and OFF signals from actuator circuit 21 are applied to the solid state switching circuit 13.

When the OFF actuator signal from circuit 21 is being supplied to switching circuit 13, the switching circuit is actuated to an "off" condition in which the impedance across the switch terminals 14 and 15 is very high, comparable to an open condition for a set of mechanical switching contacts such as the contacts 16. For this high impedance "off" condition of circuit 13, the power storage/supply circuit 22 is continuously charged. Circuit 22 supplies suitable operating voltages to both threshold circuit 12 and switch actuator circuit 21. Preferably, the storage/supply circuit 22 incorporates a voltage regulator to maintain a constant supply level to threshold circuit 12 regardless of variations in the output voltage from the external power supply 17.

Whenever solid state switching circuit 13 is actuated to its "on" condition, however, the impedance across its switch terminals 14 and 15 is very low, corresponding essentially to the operating condition for a mechanical switch with the switch contacts 16 closed. Because the storage/supply circuit 22 is connected in parallel with switch terminals 14 and 15, it receives little or no power input from the external power supply 17 under these conditions. Consequently, circuit 22 would shortly become ineffective if the switch "on" condnition were maintained continuously for switching circuit 13 for any substantial period of time. This is the reason for the recurring OFF intervals in the switch actuating signal applied to circuit 13 from actuator circuit 21 for the "on" condition of the switching circuit. During these brief OFF intervals (FIG. 4) a capacitor or other storage device in circuit 22 is recharged, and this enables the circuit to provide a continuous power supply for threshold circuit 12 and actuator circuit 21.

FIG. 2 affords a schematic diagram of a speed switch control 30 corresponding to the control 10 illustrated in FIG. 1. In control 30, a subfractional permanent magnet AC generator 11 driven from an external shaft 19 has one output terminal connected to system ground with the other output terminal connected through a rectifier diode D1 to the non-inverting input terminal 36 of a first operational amplifier A1 in a threshold circuit 12A. A voltage-regulating Zener diode Z1 is connected from terminal 36 to system ground, in parallel with a resistor R1 and a capacitor C1.

The inverting input 32 of amplifier A1 is connected to a voltage divider comprising two resistors R2 and R3. Resistor R3 is returned to system ground. Resistor R2 is connected to an output line 33 from a power storage/supply circuit 22A. Power supply connections are also provided for amplifier A1, from line 33 and to system ground.

The power storage/supply circuit 22A of speed switch control 30, FIG. 2, comprises a resistor R4 connected in series from the output line 33 to an input line 34 that is connected through a blocking diode D4 to switch terminal 14 of a solid state switching circuit 13A. A Zener diode Z2 is connected from output line 33 to system ground. A storage capacitor C2 is connected from input line 34 to system ground.

The switch actuator circuit 21A in the embodiment of FIG. 2 comprises an operational amplifier A2 having a power supply connection to output line 33 of circuit 22A and another power supply connection to system ground. The noninverting input 35 of amplifier A2 is connected to the center terminal 35 of a voltage divider comprising two resistors R7 and R9. Resistor R7 is connected to the output of amplifier A1 in threshold circuit 12A. Resistor R9 is returned to system ground.

A feedback resistor R8 is connected from the outut of amplifier A2 back to input 35.

The inverting input 38 of amplifier A2 is connected to a capacitor C3 that is returned to system ground. There is also a feedback circuit from the output of amplifier A2 to input 38. This is a parallel circuit comprising, in one branch, a resistor R6, and in the other branch, the series combination of a resistor R5 and a diode D5.

The solid state switching device 13A of speed switch control 30, FIG. 2, is a dual transistor Darlington amplifier. The input to switch 13A comprises a series resistor R10 connected from the output of amplifier A2 in actuator circuit 21A to the base of the first transistor in the Darlington amplifier. The collector and emitter of the second transistor provide the switch terminals 14 and 15. A transient protection circuit, comprising a Zener diode Z3 and a parallel capacitor C4, are connected from switch terminal 14 to the input of the Darlington amplifier.

The external circuit connected to the speed switch control 30 in FIG. 2 comprises a power supply 17 having its negative terminal connected to switch terminal 15, which is also connected to system ground. The positive terminal of power supply 17 is connected to load 18, generally indicated as a load resistor RL, which is in turn connected to the other switch terminal 14.

In considering the operation of speed switch control 30, it may first be assumed that the shaft 19 driving AC generator 11 is not rotating so that there is no AC output signal from the generator. Under these circumstances, there is no effective signal at the input 36 of amplifier A1. The only effective input to amplifier A1 is a positive DC signal at the inverting input 32 of the amplifier. As a consequence, the output from amplifier A1 is held steady at about ground potential.

Switch actuator circuit 21A is a conventional Schmitt trigger pulse generator, which requires a positive voltage at terminal 35 to produce an effective output signal. Consequently, the output from amplifier A2 is at about system ground, affording the continuous OFF signal shown in FIG. 4. For this output from amplifier A2, the Darlington amplifier 13A is cut off, with both transistors non-conductive, so that there is a very high impedance across switch terminals 14 and 15; the switch 13A is effectively open. With the switch open, capacitor C2 is charged from the external power supply 17. Zener diode Z2 maintains a steady operating voltage on line 33, regardless of fluctuations in the power supply 17 or the charge on capacitor C2.

If the shaft 19 driving generator 11 now begins to rotate, a positive-polarity DC signal, increasing in amplitude with increasing speed, is developed in the input circuit connecting the AC generator to the non-inverting input 36 of amplifier A1. As long as the voltage at terminal 36 remains below the voltage at terminal 32, there is no essential change in operating conditions because the output from the differential amplifier A1 remains at about ground potential. It should be noted that the reference voltage at terminal 32 remains constant due to the effect of the voltage regulator, circuit 22A.

When the rotational speed of generator 11 increases to a point at which the voltage at terminal 36 exceeds that at terminal 32, the output from amplifier A1 goes positive. This provides a positive input to the non-inverting input 35 of amplifier A2. As a consequence, the monostable trigger circuit 21A produces a positive output signal corresponding to the ON signal shown in FIG. 4, with recurring brief negative-going OFF intervals. Whenever the actuation signal from circuit 21A is positive, the switching circuit 13A is driven fully conductive, affording a very low impedance across the switch terminals 14 and 15 and energizing safety device 18 from power supply 17.

During the extended intervals that the switching circuit 13A is conductive, the charge on capacitor C2 maintains the requisite output voltage on line 33 to maintain amplifiers A1 and A2 in operation. Moreover, the reference voltage at terminal 32 is also maintained constant. During the "on" condition for control 30, capacitor C2 is recharged during those brief intervals in which the switching device 13A is cut off, by the OFF interval signals indicated in FIG. 4. Thus, control 30 can maintain operation in an "on" condition for an indefinite period. The duty cycle for switch actuator circuit 21A, and hence for switching circuit 13A, can be maintained at a very high level, usually 95% or more. Typically, the pulse frequency for the OFF intervals, FIG. 4, may be of the order of 300 to 400 Hz, depending upon the circuit parameters and the voltage of power supply 17, with the period T1 ranging from about 2.5 to 3.5 milliseconds and the interval duration T2 being of the order of 75 microseconds.

If generator shaft 19 now slows down, below the critical speed for control 30, so that the voltage at terminal 36 drops below the voltage at terminal 32, the output of amplifier A1 again drops to about ground potential. As a consequence, the voltage at terminal 35 drops below the level necessary to sustain operation of the pulse generator circuit 21A. The output of amplifier A2 drops to near system ground and switching device 13A is again cut off. However, this dropout action does not take place immediately when the generator slows to just below the critical speed. Instead, there is some dropout delay, determined by resistor R1 and capacitor C1.

During operation of speed switch control 30, FIG. 2, Zener diode Z1 limits the input voltage applied to amplifier A1 from generator 11, through diode D1, and prevents damage to the amplifier. This is necessary in many applications, since the output voltage from generator 11 may reach relatively high values as shown in FIG. 5.

The critical speed for generator 11 that is utilized to determine whether control 30 maintains its switch 13A "on" or "off" is determined by the ratio of resistors R2 and R3. By changing one of these resistors, a substantially different critical speed can be established. Of course, a variable resistors could be utilized if desired. On the other hand, to change the control from a normally open switch to a normally closed switch, it is only necessary to interchange the input connections to amplifier A1. Thus, if the connections for terminals 32 and 36 of amplifier A1 are reversed, control 30 will function as a normally closed switching device, with operation otherwise unchanged from that described above. By the same token, the dropout delay time during which the switch 13A is maintained actuated after shaft 19 of generator 11 falls below the critical speed can be readily adjusted by changing the resistor R1 or the capacitor C1.

In order to afford a more complete and concrete example of a speed switch control constructed in accordance with the present invention and utilizing the circuit 30 of FIG. 2, specific parameters are set forth below in Table I. With the values shown in Table I, speed switch control 30 functions as a normally open switch having a critical speed for the shaft of generator 11 of one rpm, assuming a power supply 17 having a voltage of 6–40 volts.

TABLE I

| | |
|---|---|
| R1, R2 | 1 megohm |
| R3 | 10 kilohms |
| R4 | 1 kilohm |
| R5 | 47 kilohm |
| R6 | 4.7 megohms |
| R7, R8, R9 | 100 kilohms |
| R10 | 2.2 kilohms |
| C1 | 1 microfarad |
| C2 | 22 microfarad |
| C3 | .001 microfarad |
| C4 | 680 picofarad |
| Z1, Z2 | 5.1 volts |
| 13A | 2N6385 |
| A1, A2 | LM358 |
| D1, D4 | IN 5059 |
| D5 | IN 4148 |

To illustrate the range of critical speeds that can be attained merely by changing resistor R3, Table II correlates the critical speed with various values of resistor R3.

TABLE II

| R3 (kilohms) | 10 | 47 | 100 | 220 | 470 | 1000 |
|---|---|---|---|---|---|---|
| Critical speed (rpm) | 1 | 2.5 | 4.5 | 9 | 11 | 25 |

To afford a more complete illustration of the wide range of dropout time values that can be attained with limited changes in the parameters of resistor R1 and capacitor C1, Table III is provided.

TABLE III

| R1 (megohms) | C1 (microfarads) | Drop Out Time (Sec.) |
|---|---|---|
| 0.015 | 1.0 | instantaneous |
| 0.1 | 1.0 | 0.3 |
| 0.22 | 1.0 | 1.0 |
| 0.47 | 1.0 | 1.5 |
| 1.0 | 1.0 | 2.6 |
| 2.2 | 1.0 | 4.5 |
| 4.7 | 1.0 | 7.0 |
| 10.0 | 1.0 | 9.0 |
| ∞ | 1.0 | 14.0 |
| 3.3 | 3.3 | 22.0 |
| 10.0 | 3.3 | 33.0 |
| ∞ | 3.3 | 52.0 |
| 10.0 | 10.0 | 90.0 |
| ∞ | 10.0 | 137.0 |

The data in Table III was determined with an external power supply 17 of twelve volts and a load current, through $R_L$, of approximately two amperes.

Speed switch control 30, constructed with the circuit values of Table I, provides a normally open switch with a critical shaft speed of one rpm, highly suitable for use in a safety interlock control for the doors of a passenger vehicle such as a bus. However, the same circuit, with only limited modifications, can be applied to an entirely different application. Thus, to change control 30 to function as a normally closed switch having a critical speed of 667 rpm, only the following changes need be made:

Change resistor R2 to 680 kilohms.
Change resistor R3 to 330 kilohms.
Add a feedback resistor of 4.7 megohms from the output of amplifier A1 to terminal 32.
Reverse the connections of input terminals 32 and 36 of amplifier A1.

Change resistor R10 to 22 kilohms.

Add an additional transistor, type MPS-A43, as an input stage to switching circuit 13A, maintaining the Darlington configuration.

Speed switch control 30, FIG. 2, while performing well in many applications, is sensitive to changes in load conditions. That is, changes in the external circuit comprising power supply 17 and load 18 may affect the performance more than is desirable. This difficulty is effectively eliminated in the speed switch control circuit 40 illustrated in FIG. 3, which provides other additional advantages as well. Thus, the circuit 40 of FIG. 3 provides more precise voltage regulation, allowing greater precision in control. In addition, it incorporates a single adjustable resistor that allows for changes in the critical speed, over a broad range of approximately one rpm to 500 rpm, without change of other circuit components.

Speed switch control 40, FIG. 3, is arranged for normally-closed switching operation. The AC generator 11 has one terminal connected to a resistor R11 and the other terminal connected to system ground; a voltage-regulating Zener diode Z11 is connected from the other terminal of resistor R11 back to ground. A series capacitor C11 and a diode D12 connect resistor R11 to the inverting input 42 of an operational amplifier A1 in the threshold circuit 12B. An adjustable resistor R12 is connected between the common terminal of capacitor C11 and diode D12 and system ground, in parallel with a diode D11. Diodes D11 and D12 constitute a conventional voltage doubler circuit. A capacitor C12 and a resistor R13 are connected in parallel from terminal 42 to system ground.

The non-inverting input 46 of amplifier A1 is connected to a voltage divider comprising two resistors R14 and R15 connected between the output line 43 of a power storage/supply circuit 22B and system ground. Appropriate power supply connections are also made to amplifier A1 from line 43 and from system ground. A feedback resistor R16 is connected from the output terminal 49 of amplifier A1 back to input terminal 46. The amplifier output terminal 49 is also connected to a resistor R17 in turn connected to line 43.

The power storage/supply circuit 22B comprises a transistor Q11 having its emitter connected to output line 43 and having its input, line 44, connected through a blocking diode D4 to one switch terminal 14 of a solid state switch 13B, which again constitutes a Darlington amplifier. The base of transistor Q11 is connected to system ground through the series combination of a diode D13 and a Zener diode Z12. A resistor R18 is connected between the base and collector of transistor Q11. A storage capacitor C13 is connected from input 44 to system ground.

In speed switch control 40, the switch actuator circuit 21B includes an operational amplifier provided with power supply connections to line 43 and to system ground. The non-inverting input 45 of amplifier A2 is connected through a resistor R19 to a terminal 48 that is directly connected to the line 44. Resistor R19 is a part of a voltage divider which includes an additional resistor R21 that is returned to system ground. Terminal 45 is also connected through a diode D14 to terminal 49.

In actuator circuit 21B, terminal 48 is further connected through a resistor R20 to the inverting input 47 of amplifier A2. Input terminal 47 is also connected to a Zener diode Z13 that is returned to system ground.

The switching deivce 13B of FIG. 3 remains unchanged, in its construction and external connections, from the device 13A shown in FIG. 2. This includes the external connections to the power supply 17 and the load safety device 18 through the switch terminals 14 and 15, as well as the input connection through resistor R10.

In considering the operation of speed switch control 40, FIG. 3, it may be assumed that the control is incorporated in a safety circuit for a vehicle and that a switch SW in the load circuit is closed as an incident to actuation of the ignition switch for the vehicle, at a time when the shaft 19 of generator 11 is stationary. When switch SW is closed, capacitor C13 is charged from power supply 17, through diode D4, and transistor Q11 in circuit 22B begins to conduct. As the charge on capacitor C13 builds up, the voltage at terminal 48 in actuator circuit 21B rises. The voltage at terminal 45 increases proportionally, depending upon the ratio of the voltage divider R19,R21. Usually, the two resistors R19 and R21 are approximately equal so that the voltage at terminal 45 is approximately one-half the voltage at terminal 48. Initially, the parallel circuit from terminal 48 to ground, through resistor R20 and Zener diode Z13, does not affect the voltage at terminal 45 because the Zener diode is non-conductive.

As the voltage at terminal 48 rises, the corresponding increase in the voltage at terminal 47 ultimately reaches the breakdown level for diode Z13. Once terminal 47 reaches that level, the Zener diode holds terminal 47 at its breakdown voltage. Moreover, there is now a voltage drop across resistor R20. With Zener diode Z13 conducting, the voltage at terminal 48 exceeds the voltage at terminal 47 by the drop across resistor R20.

The voltage of power supply 17 is substantially higher than the breakdown voltage of diode Z13. Consequently, as capacitor C13 continues to charge, the voltage at terminal 48 continues to increase, as does the voltage at terminal 45, until the voltage at terminal 45 exceeds the voltage at terminal 47. At this point, amplifier A2, which has previously had an OFF output, at approximately ground potential, develops an ON output which, as applied to solid state switch 13B through resistor R10, drives the Darlington amplifier switch conductive. When this occurs, the charging circuit for capacitor C13 is effectively shunted to ground through the very low impedance afforded by the output transistor of device 13B.

The charge previously stored in capacitor C13 maintains transistor Q11 conductive and also maintains amplifier A2 in the operating condition to produce an ON actuation signal. However, the charge on capacitor C13 slowly dissipates. As it does, the potential at terminal 45 is gradually reduced and ultimately falls back below the potential at terminal 47, which remains at the breakdown voltage for diode Z13. When the voltage at terminal 45 drops below that at terminal 47, amplifier A2 is cut off and its output drops to near ground potential, with the result that device 13B is switched "off". This produces a brief OFF interval (FIG. 4) during which capacitor C13 recharges to a point at which the voltage at terminal 45 again exceeds that at terminal 47, when the control returns to its "on" condition. Thus, the ON signal output of switch actuator 21B again corresponds to that shown in FIG. 4, and this is the initial operating condition for the actuator circuit, making control 40 a normally closed switch control.

To establish control 40 in its "off" condition it is necessary to maintain the voltage at terminal 45 in actuator circuit 21B below the voltage of terminal 47. For this condition, the output from actuator circuit 21B corresponds to the OFF signal of FIG. 4. This action is effected by threshold circuit 12B and the connection from that circuit to actuator circuit 21B afforded by diode D14.

When control 40 is first placed in operation, with shaft 19 stationary, there is a constant input signal to terminal 46 from the regulated source afforded by circuit 22B, line 43, and voltage divider R14,R15. There is no effective input at the other terminal 42 of amplifier A1. In effect, the output terminal 49 of amplifier A1 remains at the power supply potential of line 43, due to the presence of the connecting resistor R17, and any current flow from terminal 45 to terminal 49 through diode D14 is precluded.

When shaft 19 now begins to rotate, as when movement of the vehicle is started, a positive input signal is applied to terminal 42 of amplifier A1 through the rectifier circuit comprising voltage doubler D11,D12, the applied voltage increasing with increasing speed. When the voltage at terminal 42 reaches the same level as the voltage at terminal 46, the output terminal 49 of amplifier A1 goes to approximately ground potential. This allows a current flow from terminal 45 through diode D14 to terminal 49, so that terminal 45 is also driven to near ground potential. This maintains amplifier A2 in an operating condition in which its output is essentially at ground, the OFF signal of FIG. 4, actuating switch 13B to its "off" condition.

Initially, the voltage at terminal 46 in threshold circuit 12B is fixed, since the voltage on line 43 is well regulated by the power storage/supply circuit 22B. However, as the voltage at the amplifier output terminal 49 rises, the feedback resistor R16 causes some increase in the potential at terminal 46. This provides a limited hysteresis effect in the operation of threshold circuit 12B.

As in the previously described embodiment, threshold circuit 12B affords a dropout delay time, in this instance determined by the parameters selected for capacitors C12 and resistor R13. The use of the voltage coupler circuit D11,D12 increases the sensitivity of the threshold circuit. The adjustable resistor D12 affords an effective control for the critical speed of control 40. This one adjustable circuit element makes it possible to adjust the control for operation at critical speeds from 500 rpm down to two rpm or even lower with no change of other circuit components.

Furthermore, as noted above, the control 40 of FIG. 3 is not particularly load-sensitive. A decrease in the load resistance RL, or other load change causing an increased load current, simply decreases the duration T2 of of the brief OFF intervals in the ON signal output from actuator circuit 21B (see FIG. 4). If the circuit is properly constructed, with adequate charging time for capacitor C13 for relatively high load currents, it will function over a broad range of load current changes with no difficulty. There may also be some variation in the overall period T1 for the recurring OFF interval pulses in the ON signal output from actuator circuit 21B, but it is a simple matter to keep the frequency of these OFF pulses high enough so that they do not affect the operation of the load safety device 18. It will be recognized that control 40 can be changed from a normally closed switching device, as illustrated, to a normally open device, again merely by reversing the circuit connections to the input terminals 42 and 46 of amplifier A1.

Typical circuit parameters for control 40, FIG. 3, for operation with a power supply of six to 40 volts DC and a maximum load current of five amperes, and with a critical speed range of approximately 2–500 rpm, are set forth in Table IV. It will be understood that the specific circuit parameters incorporated in the tables are presented solely by way of illustration and in no sense as a limitation on the invention.

TABLE IV

| | |
|---|---|
| R10 | 270 Ω ohms |
| R11 | 10K Ω ohms |
| R12 (adjustable) | 1 megohm |
| R13 | 220 Kilohms |
| R14 | 15 Kilohms |
| R15 | 18 Kilohms |
| R16 | 22 Kilohms |
| R17 | 10 Kilohms |
| R18 | 1.2 Kilohms |
| R19 | 12 Kilohms |
| R20 | 1 Kilohm |
| R21 | 10 Kilohms |
| C11 | .1 microfarad |
| C12 | 1 microfarad |
| C13 | 6.8 microfarad |
| Z11 | 5.1 volts |
| Z12 | 6.2 volts |
| Z13 | 3.6 volts |
| D4 | Diode 1 ampere |
| D11 | Diode 1 ampere |
| D12 | Diode 1 ampere |
| D13 | Diode 1 ampere |
| D14 | Diode 1 ampere |
| 13A | 2N6385 |
| A1, A2 | LM358 |

I claim:

1. A two-terminal precision speed switch control actuated by changes in the rotational speed of a shaft and adaptable to operation over a broad speed range down to less than ten rpm comprising:

a sub-fractional AC generator, connectible to a rotary shaft, for generating an AC signal having an amplitude which varies with changes in shaft speed;

a threshold circuit, connected to the generator, for developing first and second threshold signals, one indicative of an AC signal input exceeding a given threshold amplitude corresponding to a critical shaft speed and the other indicative of an AC signal input below the threshold amplitude;

a switch actuator circuit, coupled to the threshold circuit, for developing ON and OFF switch actuation signals corresponding to the first and second threshold signals, the OFF signal being a continuous DC signal and the ON signal being a semi-continuous DC signal of high duty cycle including brief recurring OFF intervals;

a solid-state switching circuit, having two switch terminals connectible in series with an external power supply in an operating circuit for a controlled load and having an actuation input connected to the switch actuator circuit, actuatable to an "on" condition in which the impedance across the switch terminals is very low, in response to the ON switch actuation signal, and actuatable to an "off" condition in which the impedance across the switch terminals is very high, in response to the OFF switch actuation signal;

and a power storage/supply circuit, connected in parallel with the switch terminals, affording a power supply for the threshold circuit and the switch actuator circuit, and including a storage device which is re-charged during intervals in which the switching circuit is in its "off" condition.

2. A speed switch control according to claim 1 in which the switch actuator circuit is a monostable trigger circuit having a duty cycle of the order of 95% or more.

3. A speed switch control according to claim 1 in which the switch actuator circuit comprises an amplifier responsive to the level of charge on a storage device comprising a part of the power storage/supply circuit.

4. A speed switch control according to claim 3 in which the switch actuator circuit comprises an operational amplifier having an inverting input and a non-inverting input, one input of the amplifier being connected to a voltage divider affording an input voltage proportional to the charge on the storage device in the power storage/supply circuit, the other input of the amplifier being connected to a clamp circuit affording an input voltage limited to a predetermined maximum value.

5. A speed switch control according to claim 4, in which the threshold circuit comprises an amplifier having its output connected to the one input of the actuator circuit amplifier in a circuit that maintains that one actuator circuit amplifier input at a reference level whenever one of the threshold signals is present.

6. A speed switch control according to claim 1 in which the power storage/supply circuit includes a voltage-regulated output, and in which the threshold circuit comprises an operational amplifier having an inverting input and a non-inverting input, with one amplifier input coupled to the generator through a rectifier circuit and the other amplifier input connected to the regulated output of the power storage/supply by a reference circuit, in which a change between normally-closed and normally-open operation for the switching circuit is effected by interchanging the input connections to that operational amplifier.

7. A speed switch control according to claim 6 in which the rectifier circuit in the threshold circuit includes a time delay circuit to delay a change in operating condition of the switching circuit upon deceleration of the generator to a speed below the critical speed.

8. A speed switch control according to claim 6 in which the rectifier circuit in the threshold circuit includes an adjustable impedance for varying the critical speed of the control over a broad speed range.

* * * * *